US008760186B2

(12) United States Patent
Schultz

(10) Patent No.: US 8,760,186 B2
(45) Date of Patent: Jun. 24, 2014

(54) PROBE APPARATUS ASSEMBLY AND METHOD

(75) Inventor: Mark D. Schultz, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 916 days.

(21) Appl. No.: 12/708,774

(22) Filed: Feb. 19, 2010

(65) Prior Publication Data

US 2011/0203108 A1    Aug. 25, 2011

(51) Int. Cl.
*G01R 31/01* (2006.01)
*G01R 1/067* (2006.01)

(52) U.S. Cl.
CPC ........ *G01R 1/06716* (2013.01); *G01R 1/06744* (2013.01)
USPC .................................... 324/755.05

(58) Field of Classification Search
None
See application file for complete search history.

(56) References Cited

U.S. PATENT DOCUMENTS

| 4,340,858 A * | 7/1982 | Malloy .................... 324/754.08 |
| 4,724,383 A * | 2/1988 | Hart ........................ 324/750.25 |
| 5,355,128 A * | 10/1994 | Riordan ..................... 340/854.7 |
| 5,801,599 A * | 9/1998 | Flynn et al. ..................... 333/26 |
| 6,053,777 A * | 4/2000 | Boyle ........................... 439/700 |
| 6,107,816 A * | 8/2000 | Kearney et al. .......... 324/750.03 |
| 6,417,684 B1 | 7/2002 | Schmid et al. |
| 6,528,984 B2 * | 3/2003 | Beaman et al. .......... 324/755.08 |
| 6,676,438 B2 | 1/2004 | Zhou et al. |
| 6,701,612 B2 | 3/2004 | Khandros et al. |
| 6,830,460 B1 * | 12/2004 | Rathburn ....................... 439/66 |
| 6,844,748 B2 * | 1/2005 | Sato et al. ............... 324/756.01 |
| 6,956,386 B2 | 10/2005 | Kim et al. |
| 7,253,653 B2 | 8/2007 | Ham et al. |
| 8,048,794 B2 * | 11/2011 | Knickerbocker ............ 438/618 |
| 2002/0135069 A1 * | 9/2002 | Wood et al. .................... 257/758 |
| 2006/0046528 A1 * | 3/2006 | Beaman et al. ................. 439/66 |
| 2008/0061808 A1 | 3/2008 | Mok et al. |
| 2008/0218188 A1 | 9/2008 | Arai et al. |
| 2008/0231305 A1 | 9/2008 | Khandros et al. |
| 2008/0297186 A1 | 12/2008 | Chong et al. |
| 2009/0256583 A1 * | 10/2009 | Chen et al. .................... 324/761 |
| 2011/0042820 A1 * | 2/2011 | Knickerbocker ............. 257/774 |

* cited by examiner

*Primary Examiner* — Jermele M Hollington
(74) *Attorney, Agent, or Firm* — Cantor Colburn LLP; Vazken Alexanian

(57) ABSTRACT

A probe apparatus is provided and includes a probe layer formed with a through-hole, a conductor, electrically coupled to test equipment, disposed on and insulated from a through-hole sidewall, a probe disposed within the through-hole to be spaced from the conductor and thereby movable upon application of an external force thereto and a compliant layer connected to the probe and sufficiently compliant to allow the probe to at least temporarily contact the conductor upon the application of the external force thereto.

24 Claims, 5 Drawing Sheets

PROBE APPARATUS ASSEMBLY AND METHOD

BACKGROUND

Aspects of the present invention are directed to a probe apparatus, a method of assembling a probe apparatus and a method of operating a probe apparatus.

As electronic devices become increasingly small, their individual components become increasingly small as well. Device contact pitches, therefore, particularly in the areas of silicon carriers and other 3D technologies, continue to tighten and are, in many cases, on a scale of less than 50 microns. Current test probe technologies, however, do not typically extend to pitches of 50 microns or less and, thus, are often incompatible with many modern devices.

Rigid interposers have been proposed as a solution to this problem, but relatively small and non-compliant solder balls and the lack of flatness in the devices being tested make it unclear if this approach can be successful. Similar concerns apply to testing of carriers that require a "loopback" function to be tested. Currently, the proposed solutions to these problems involve temporarily soldering on the "loopback" but, in practice, this does not appear to be effective.

SUMMARY

In accordance with an aspect of the invention, a probe apparatus is provided and includes a probe layer formed with a through-hole, a conductor, electrically coupled to test equipment, disposed on and insulated from a through-hole sidewall, a probe disposed within the through-hole to be spaced from the conductor and thereby movable upon application of an external force thereto and a compliant layer connected to the probe and sufficiently compliant to allow the probe to at least temporarily contact the conductor upon the application of the external force thereto.

In accordance with another aspect of the invention, a probe apparatus is provided and includes a probe layer formed with a through-hole, a conductor, electrically coupled to test equipment, disposed on and insulated from a through-hole sidewall, a probe disposed within the through-hole to be spaced from the conductor and thereby movable upon application of an external force thereto and a mounting stud supportably coupled to the probe by an elastic element sufficiently compliant to allow the probe to at least temporarily contact the conductor upon the application of the external force thereto.

In accordance with another aspect of the invention, a probe apparatus is provided and includes a probe layer formed with a through-hole, a conductor, electrically coupled to test equipment, disposed on and insulated from a through-hole sidewall and a probe disposed within the through-hole to be spaced from the conductor and thereby movable upon application of an external force thereto and including an elastic element, coupled to the probe and anchored on the probe layer, the elastic element being sufficiently compliant to allow the probe to at least temporarily contact the conductor upon the application of the external force thereto.

In accordance with another aspect of the invention, a probe apparatus is provided and includes a probe layer formed with two or more through-holes, conductors, independently electrically coupled to test equipment, disposed on and insulated from a sidewall of each of the through-holes, a probe disposed within each of the through-holes, each probe being spaced from the corresponding conductor and thereby movable upon application of external forces thereto and a compliant layer connected to each of the probes and sufficiently compliant to independently allow each of the probes to at least temporarily contact each of the corresponding conductors upon the respective application of the external forces to the probes In accordance with another aspect of the invention, a probe apparatus is provided and includes a compliant layer to support two or more probes within corresponding through-holes in a probe layer such that the probes are spaced from conductors disposed on respective through-hole sidewalls and thereby movable upon application of external forces thereto, the support of the two or more probes being achieved with sufficient compliance to independently allow each of the probes to at least temporarily contact the corresponding conductors upon the respective application of the external forces thereto.

In accordance with another aspect of the invention, a method of assembling a probe apparatus is provided and includes forming a probe layer with a through-hole, sequentially coating a through-hole sidewall with insulation and a conductor electrically coupled to test equipment, disposing a probe within the through-hole to be movable upon an application of an external force thereto and supporting the probe with sufficient compliance to allow the probe to at least temporarily contact the conductor upon the application of the external force thereto.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

The use of through-silicon-vias (TSV) and other micro-electro-mechanical system (MEMS) technologies makes possible a microplunger testing probe apparatus for use with a device having a desired and, in many cases, small (e.g., less than 50 microns) device contact pitch that is also relatively compliant. This type of structure could be attached to a test board for both regular testing functions and loopback functionality and could be incorporated into a socket for product application to thereby allow the device to be removed and reinserted without reflow.

Figure 1:
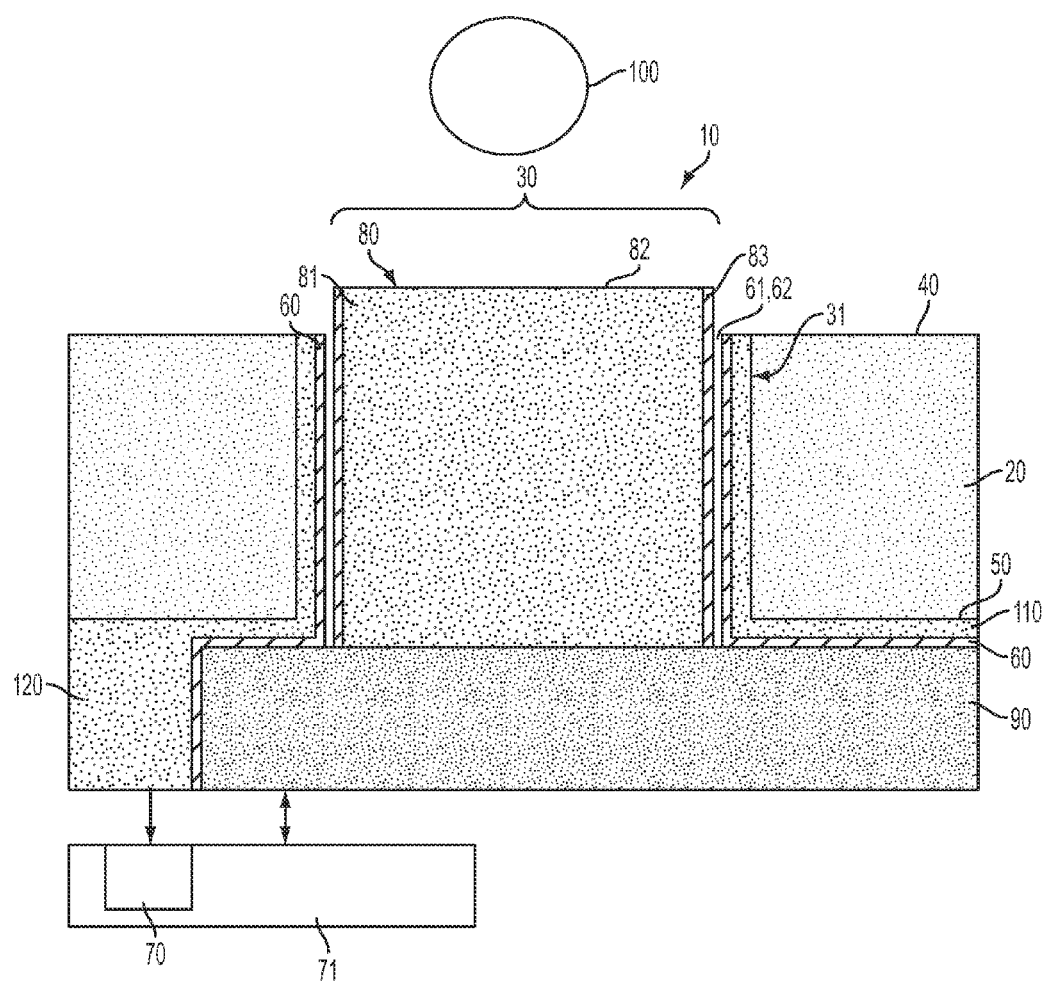
FIG. 1 is a cross-sectional view of a probe apparatus in accordance with embodiments of the invention.

With reference to FIG. 1, a probe apparatus 10 is provided and includes a probe layer 20 formed with a through-hole 30 extending between first and second opposing surfaces 40 and 50. A conductor 60 is disposed on and insulated from a sidewall 31 of the through-hole 30. The conductor 60 is electrically coupled to test equipment 70 mounted on a substrate 71. A probe 80 is disposed within the through-hole 30 to be normally spaced from the conductor 60. The probe 80 is thereby movable with respect to the conductor 60. The probe 80 includes a probe body 81 having a probe end 82 protruding from the through-hole 30. A compliant layer 90 may be anchored to the substrate 71 such that it is disposed proximate to the probe layer 20. The compliant layer 90 connects to the probe body 81 and may be formed to be sufficiently compliant to allow the probe body 81 to at least temporarily contact the conductor 60 upon an application of force to the probe end 82.

The probe body 81 may be elongate and cylindrical in some cases such that the connection between the probe body 81 and the compliant layer 90 is achievable over a relatively large surface area. The probe end 82 may be generally flat, textured, curved or pointed in accordance with the requirements of various applications.

Space 61 between the probe body 81 and the conductor 60 is provided by the removal of a release layer 62. The release layer 62 can be formed of any removable material and creates separation between the probe body 81 and the conductor 60 until the compliant layer 90 is formed or, more generally, until the probe apparatus 10 is operational. In particular, the release layer 62 may be formed of $SiO_2$ or a chemical vapor deposited (CVD) polymer or resist.

The application of force to the probe end 82 may be provided by the probe apparatus being placed into pressed contact with a device contact 100, such as a solder ball, of a device to be tested. This device may have multiple device contacts 100 with a device contact pitch of 50 microns or less. In these cases, the probe apparatus 10 will be formed to include multiple probes 80 and with a similar pitch. As such, since each probe 80 would be connected to the compliant layer 90 in a similar fashion, each probe 80 will contact its corresponding conductor 60 in response to contact with a corresponding device contact 100. Moreover, due at least in part to the compliance of the compliant layer 90, the multiple contacts between the individual probes 80 and their corresponding device contacts 100 will be testable without substantial force transmission between probes 80 even if the device contacts 100 are themselves non-compliant or irregularly arranged.

In this case, the non-compliance of the device contacts 100 may result from the device contacts 100 being formed of certain non-compliant materials and with particularly small sizes that preclude compliance. The irregular arrangement may result from the device contacts 100 being supported on a non-flat substrate or being formed in irregular shapes on an individual basis.

The probe layer 20 may be formed of a conductive material and, in particular, may be formed of silicon or some other similar material, such as germanium or a combination of similar suitable materials. The probe layer 20 is generally planar with the first and second surfaces 40 and 50 opposing one another with one (i.e., second surface 50, as shown in FIG. 1) facing the substrate 71 and the other (i.e., first surface 40, as shown in FIG. 1) facing away from the substrate 71. The through-hole 30 is bored into and through the probe layer 20 by, e.g., a deep etching process, and therefore extends from the first surface 40 to the second surface 50.

The conductor 60 is insulated from the sidewall 31 of the through-hole 30 by an insulation layer 110 formed thereon. The insulation layer 110 may include a thermal oxide, such as silicon oxide in the exemplary case of the probe layer 20 being formed of silicon, and may be disposed to at least partially coat the sidewall 31 and at least a portion of second surface 50.

The conductor 60 may include a conductive metal, such as gold or some other similar material. The probe body 81, on the other hand, may include a conductive metal, such as copper, tungsten, some other similar metals and/or some combination thereof. In addition, the probe body 81 may further include a conductive coating 83 that could be formed of a unique material or, in some cases, a material similar to that of the conductor 60. With these materials, during a device test, when the probe 80 contacts a device contact 100 and the conductor 60, a signal may propagate sequentially from the device contact 100 to the probe body 81, the conductive coating 83, the conductor 60 and the test equipment 70.

The compliant layer 90 may include an elastomeric material, such as rubber, silicone, some other similar material and/or some combination thereof. The compliant layer 90 could therefore be applied to the probe 80 for connection thereto and/or the substrate 71. Once applied, the compliant layer 90 is cured by a suitable curing operation based on the type of elastomeric material employed. In any case, the compliant layer 90 will be formed such that the compliance thereof is localized proximate to the through-hole 30. In this way, the compliance will not be transmitted in a significant manner to another nearby probe 80. As such, the testing of any one particular device contact 100 can be isolated from other tests.

As shown in FIG. 1, the probe apparatus 10 may further include a mounting stud 120, which may be electrically interposed between the test equipment 70 and the conductor 60. The mounting stud 120 may be supported on the substrate 71 and electrically coupled to contacts of the test equipment 70 thereon. The mounting stud 120 and the conductor 60 may be formed of similar materials and in single or multiple components. For example, the mounting stud 120 may include first and second layers thereof which aid in the formation and assembly of the probe apparatus 10.

Figure 2:
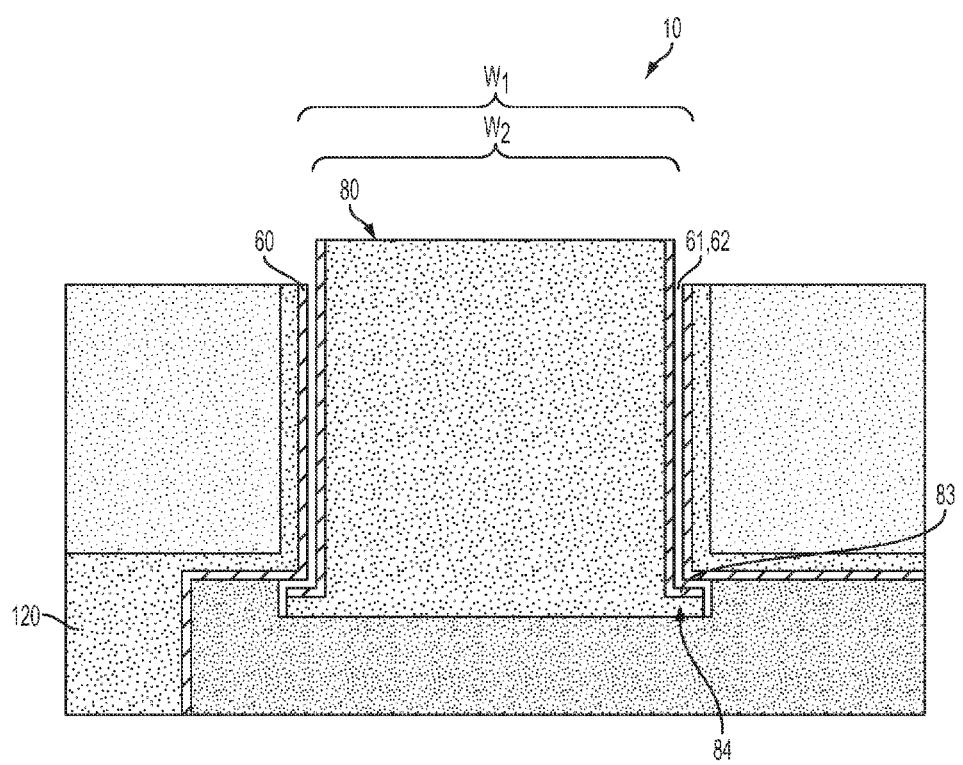
FIG. 2 is a cross-sectional view of a probe apparatus in accordance with embodiments of the invention.

With reference now to FIG. 2, the probe body 81 may include a flange 84 at an end thereof proximate to the second surface 50. In this case, the flange 84 is wider than the probe body 81 and may have a width $W_1$ that is greater than a predominant width $W_2$ of the through-hole 30. As shown, the flange 84 may be formed of similar materials as the probe body 81 and may be coated by a portion of the conductive coating 83. With this construction, the probe 80 may be secured in the through-hole 30 and its ability to transmit force to and from the compliant layer 90 may be enhanced.

In the embodiments of FIGS. 1 and 2, the positioning of the probe 80 could be designed such that contact between the probe body 81 and the device contact 100 is intentionally slightly off center. Such contact would then reliably force the side of the probe body 81 into electrical contact with the conductor 60. However, the probe body 81 will be generally relatively tall with respect to its width $W_1$ and, as such, the probe body 81 will not likely remain centered in the through-hole 30 under load in any case.

Figure 3:
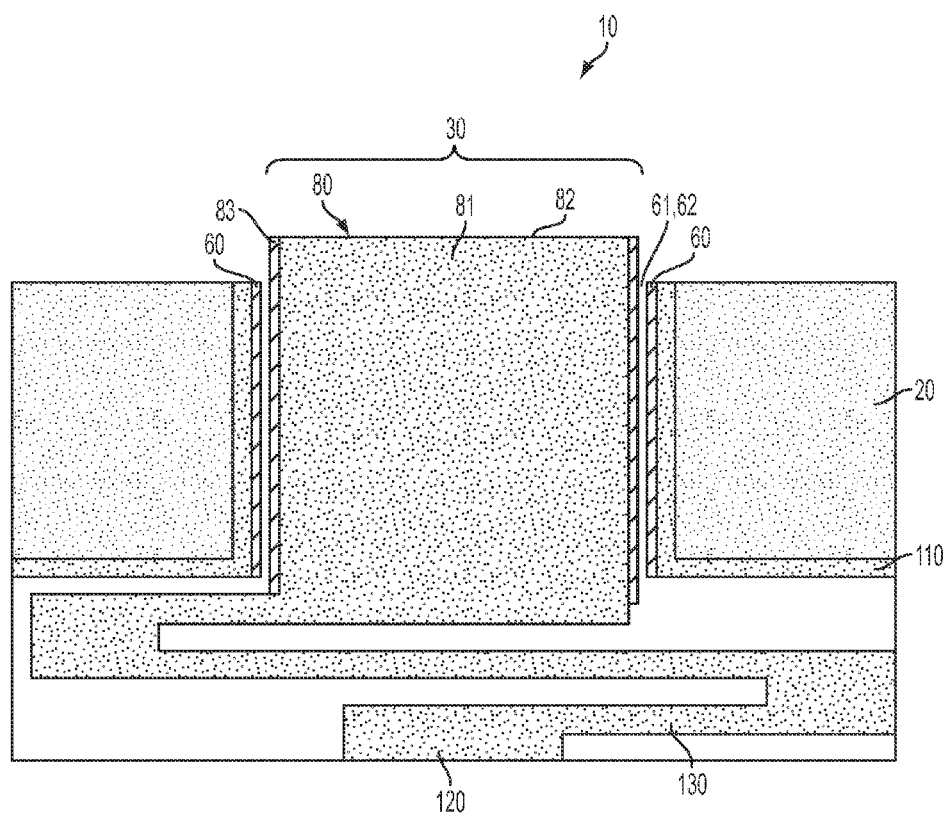
FIG. 3 is a cross-sectional view of a probe apparatus in accordance with embodiments of the invention.
Figure 4:
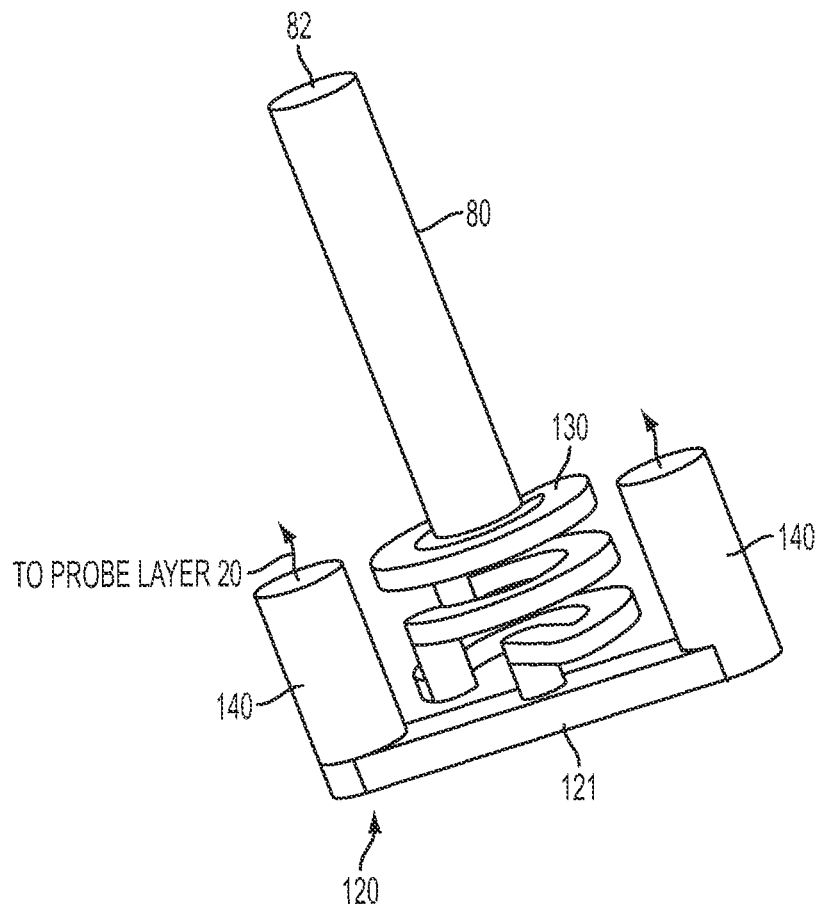
FIG. 4 is a perspective view of a probe apparatus in accordance with embodiments of the invention.

With reference now to FIGS. 3 and 4, the probe apparatus 10 in accordance with further embodiments is shown. In these embodiments, the mounting stud 120 is supportably coupled to the probe body 81 by an elastic element 130. The elastic element 130 is sufficiently compliant to allow the probe body 81 to contact the conductor 60 upon application of force to the probe end 82 and may also serve as a secondary conductor. The mounting stud 120 includes a base 121 on which the elastic element 130 is anchored and one or more pins 140, which are supported on the base 121 and which are anchored on, for example, the probe layer 20. The elastic element 130 may be a spring or otherwise be spring loaded with the compliance thereof provided as the elastic element 130 is compressed due to the application of the force to the probe end 82. The pins 140 may be anchored by way of mechanical fastening and/or chemical adhesion and provide a counter balance to the elastic element 130 compliance. In exemplary embodiments, the pins 140 may be attached by being deposited in place onto a back of the probe layer 20 by plating or some other similar deposition technique.

Figure 5:
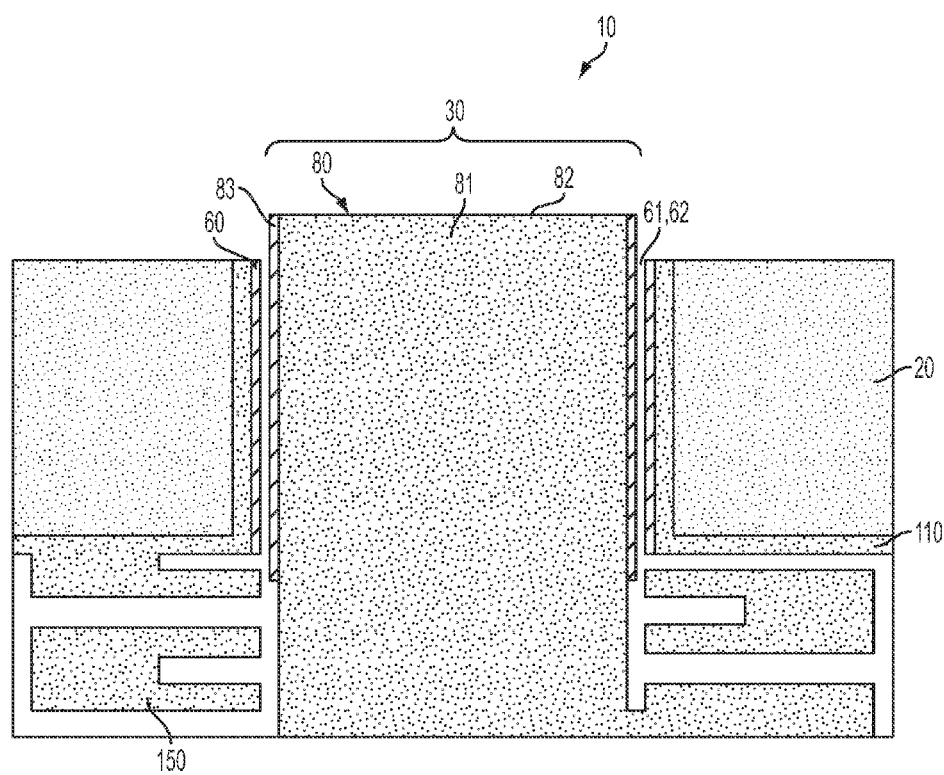
FIG. 5 is a cross-sectional view of the probe apparatus of FIG. 4.

With reference to FIG. 5, the probe apparatus 10 in accordance with further embodiments is shown. In these embodiments, an elastic element 150 is coupled to the probe body 81 and is anchored on the probe layer 20. The elastic element 150 is sufficiently compliant to allow the probe body 81 to contact the conductor 60 upon application of force to the probe end 82.

In the embodiments of FIGS. 3-5, the elastic elements 130 and 150 may be electrically coupled to the test equipment 70 either directly and/or through other connection points or mounting studs. In addition, there may be other and/or additional rigid connections between the probe layer 20 and the substrate 71 for additional structural support. Moreover, with these embodiments, electrical contact between the probe body 81 with the conductor 60 is not always necessary even if such contact provides for a relatively short electrical path and is, therefore, effective.

In accordance with further aspects of the invention, a method of assembling a probe apparatus 10 is provided. The method may include forming a probe layer 20 with a through-hole 30 bored therein, coating a sidewall 31 of the through-hole 30 with a conductor 60 insulated from the sidewall 31 and electrically coupled to test equipment 70, disposing a probe 80 within the through-hole, the probe 80 including the probe body 81 having the probe end 82 protruding from the through-hole 30 and supporting the probe 80 with sufficient compliance to allow the probe body 81 to, in some cases, assure contact with the conductor 60 upon application of force to the probe end 82.

As mentioned above, the forming of the probe layer 20 may include boring the through-hole 30 into the probe layer 20 by way of a deep etching operation or some other similar process. The coating of the conductor 60 and the insulation layer 110 may include at least one of sputtering and/or CVD processes. The disposing of the probe 80 may be facilitated by the removable disposition of the release layer 62 for its temporary interposition between the conductor 62 and the probe body 81. In exemplary embodiments, the disposing of the probe 80 may be accomplished by plating or otherwise depositing a layer or layers of probe material onto the release layer 62.

In accordance with further aspects, a method of operating a probe apparatus 10 assembled in accordance with the methods described above is provided and includes bringing the probe(s) 80 of the probe apparatus 10 into press contact with the device contact(s) 100 of the device to be tested. Here, the probe apparatus 10 may be disposed above or below the device to be tested and either or both the probe apparatus 10 and/or the device may be movable toward and/or away from the other. In this way, a device test may be conducted by way of positional control of the probe apparatus 10 and/or the device.

Wiring the conductor 60 and/or the mounting stud 120 to exterior components could be accomplished by use of back-end-of-line (BEOL) wiring layers to distribute signals outside the contact area. This type of arrangement would likely be particularly useful for low power signals as the wiring would likely be too fine to carry relatively large power and ground currents, which could be carried by planes that are inserted within BEOL technology and/or integrated decoupling capacitors (Decaps).

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A probe apparatus, comprising:
    a probe layer formed with a through-hole having a through-hole sidewall;
    an insulation layer disposed to line the through-hole sidewall;
    a conductor, electrically coupled to test equipment, disposed on the insulation layer and thereby insulated from the through-hole sidewall;
    a probe disposed within a space defined by the conductor within the through-hole such that the probe, the conductor, the insulator and the through-hole sidewall are substantially coaxial, the probe being normally spaced from the conductor within the space and movable into contact with the conductor upon application of an external force thereto, which is provided from pressed contact between a longitudinal end of the probe and a device contact; and
    a compliant layer connected to the probe and sufficiently compliant to allow the probe to temporarily contact the conductor upon the application of the external force thereto.

2. The probe apparatus according to claim 1, wherein the probe layer comprises Silicon.

3. The probe apparatus according to claim 1, wherein the insulation layer comprises an oxide.

4. The probe apparatus according to claim 1, wherein the conductor comprises a conductive metal.

5. The probe apparatus according to claim 1, wherein the probe comprises a conductive metal.

6. The probe apparatus according to claim 1, wherein the conductive metal of the probe comprises at least one of Copper and Tungsten.

7. The probe apparatus according to claim 5, wherein the probe further comprises a conductive coating.

8. The probe apparatus according to claim 7, wherein the conductor and the conductive coating are each formed of similar materials.

9. The probe apparatus according to claim 1, wherein the compliant layer comprises an elastomeric material.

10. The probe apparatus according to claim 1, further comprising a mounting stud electrically interposed between the test equipment and the conductor.

11. The probe apparatus according to claim 1, wherein the applied force is the probe being pressed onto a device contact.

12. The probe apparatus according to claim 1, wherein the probe comprises a flange having a greater width than that of the through-hole.

13. A probe apparatus, comprising:
    a probe layer formed with a through-hole;
    a conductor, electrically coupled to test equipment, disposed on and insulated from a through-hole sidewall;
    a probe disposed within the through-hole to be normally spaced from the conductor and thereby movable upon application of an external force thereto; and
    a mounting stud supportably coupled to the probe by an elastic element sufficiently compliant to allow the probe to temporarily contact the conductor upon the application of the external force thereto.

14. The probe apparatus according to claim 13, wherein the mounting stud comprises a base on which the elastic element is anchored and one or more pins, supported on the base, which are anchored on the probe layer.

15. A probe apparatus, comprising:
a probe layer formed with a through-hole;
a conductor, electrically coupled to test equipment, disposed on and insulated from a through-hole sidewall; and
a probe disposed within the through-hole to be normally spaced from the conductor and thereby movable upon application of an external force thereto and including an elastic element, coupled to the probe and anchored on the probe layer, the elastic element being sufficiently compliant to allow the probe to temporarily contact the conductor upon the application of the external force thereto.

16. The probe apparatus according to claim 15, wherein the elastic element comprises a secondary conductor.

17. A probe apparatus, comprising:
a probe layer formed with two or more through-holes;
conductors, independently electrically coupled to test equipment, disposed on and insulated from a sidewall of each of the through-holes;
a probe disposed within each of the through-holes, each probe being normally spaced from the corresponding conductor and thereby movable upon an application of external forces thereto; and
a compliant layer connected to each of the probes and sufficiently compliant to independently allow each of the probes to temporarily contact each of the corresponding conductors upon the respective application of the external forces to the probes.

18. A probe apparatus comprising a compliant layer to support two or more probes within corresponding through-holes in a probe layer such that the probes are normally spaced from conductors disposed on respective through-hole sidewalls and thereby movable upon an application of an external force thereto, the support of the two or more probes being achieved with sufficient compliance to independently allow each of the probes to temporarily contact the corresponding conductors upon the respective application of the external forces thereto.

19. A method of assembling a probe apparatus, the method comprising:
forming a probe layer with a through-hole;
sequentially coating a through-hole sidewall with insulation and a conductor electrically coupled to test equipment;
disposing a probe within the through-hole to be normally spaced from the conductor and thereby movable upon an application of an external force thereto; and
supporting the probe with sufficient compliance to allow the probe to temporarily contact the conductor upon the application of the external force thereto.

20. The method according to claim 19, wherein the forming comprises boring the through-hole through the probe layer.

21. The method according to claim 19, wherein the coating comprises at least one of sputtering and chemical vapor deposition (CVD).

22. The method according to claim 19, further comprising removably disposing a release layer temporarily interposed between the conductor and the probe.

23. The method according to claim 19, wherein the disposing comprises a deposition of probe material onto a release layer to temporarily coat at least a portion of the conductor.

24. A method of operating a probe apparatus assembled in accordance with the method of claim 19, the method comprising bringing the probe into press contact with a device contact.

* * * * *